United States Patent
Knighten et al.

(10) Patent No.: US 7,652,364 B2
(45) Date of Patent: Jan. 26, 2010

(54) CROSSING CONDUCTIVE TRACES IN A PCB

(75) Inventors: James L. Knighten, Poway, CA (US);
Norman Smith, San Marcos, CA (US);
Jun Fan, San Marcos, CA (US)

(73) Assignee: Teradata US, Inc., Miamisburg, OH (US)

( * ) Notice: Subject to any disclaimer, the term of this patent is extended or adjusted under 35 U.S.C. 154(b) by 589 days.

(21) Appl. No.: 11/563,972

(22) Filed: Nov. 28, 2006

(65) Prior Publication Data

US 2007/0138626 A1    Jun. 21, 2007

Related U.S. Application Data

(60) Provisional application No. 60/752,471, filed on Dec. 21, 2005.

(51) Int. Cl.
*H01L 23/52* (2006.01)
*H05K 7/00* (2006.01)
*H01R 12/04* (2006.01)

(52) U.S. Cl. .............. 257/692; 257/774; 257/776; 257/E23.046; 257/E23.152; 361/777; 174/261; 174/262

(58) Field of Classification Search .............. None
See application file for complete search history.

(56) References Cited

U.S. PATENT DOCUMENTS

| | | | | | |
|---|---|---|---|---|---|
| 3,757,028 | A | * | 9/1973 | Schlessel | 174/33 |
| 5,039,824 | A | * | 8/1991 | Takashima et al. | 174/33 |
| 5,430,247 | A | * | 7/1995 | Bockelman | 174/33 |
| 5,871,655 | A | * | 2/1999 | Lee et al. | 216/22 |
| 7,049,694 | B2 | * | 5/2006 | Zhou et al. | 257/692 |
| 7,271,985 | B1 | * | 9/2007 | Buhler et al. | 360/245.9 |

FOREIGN PATENT DOCUMENTS

| | | | | |
|---|---|---|---|---|
| JP | 05235245 | A | * | 9/1993 |
| WO | WO9506946 | | * | 3/1995 |

* cited by examiner

*Primary Examiner*—Alonzo Chambliss
(74) *Attorney, Agent, or Firm*—John D. Cowart

(57) ABSTRACT

A printed circuit board includes at least two conductive traces, each having a first portion and a second portion. The printed circuit board also includes a cross-over section that includes two electrically conductive portions, each connecting electrically to the first and second portions of a corresponding one of the conductive traces, such that the conductive traces in their first portions lie on opposite sides of each other as they do in their second portions.

17 Claims, 4 Drawing Sheets

CROSSING CONDUCTIVE TRACES IN A PCB

CROSS-REFERENCE TO RELATED APPLICATIONS

This application claims priority from U.S. Provisional Application 60/752,471, filed on Dec. 21, 2005, by James L. Knighten, Norman W. Smith, and Jun Fan. This application is related to, and incorporates by reference, U.S. application Ser. No. 11/563,820, titled "Passing Multiple Conductive Traces Through a Thru-Hole Via in a PCB," and filed on Nov. 28, 2006 by Jun Fan, Arthur R. Alexander, James L. Knighten, Norman W. Smith, and Joseph Fleming (NCR matter 12226); and to U.S. application Ser. No. 11/563,729, titled "Using a Thru-Hole Via to Improve Circuit Density in a PCB," and filed on Nov. 28, 2006, by James L. Knighten, Jun Fan and Norman W. Smith (NCR matter 12336).

BACKGROUND

Differential signaling is commonly used in high-speed digital signaling applications for a variety of reasons. For example, differential signals tend to require lower voltage swings than single-ended signals. This is true because the differential threshold in a differential receiver is more easily controlled than the threshold of a single transistor. Lower voltage swings lead to faster circuits and, quite often, lower power consumption.

Differential signaling also reduces electromagnetic interference (EMI), because the opposite currents carried on the coupled conductive traces of the differential signal line leads to cancellation, at large distances from the signal lines, of the electric and magnetic fields that occur in the signal lines. Similarly, differential signals are less sensitive to crosstalk.

Differential signals do, however, suffer from one significant drawback. When the layout of a pair of edge-coupled differential signal traces changes direction (i.e., makes a "turn") on a printed circuit board (PCB), one of the two traces becomes longer than the other trace, and the perfect balance of the differential signal is degraded. This degradation in the differential signal, which is known as "delay skew" or simply "skew," increases the EMI radiation from the differential signal pair and increases crosstalk.

FIGS. 1, 2 and 3 illustrate the phenomenon of delay skew in three types of turns taken by differential signal traces on PCBs. FIG. 1 shows the skew resulting from a square turn by the differential signal traces; FIG. 2 shows the skew resulting from an angled turn; and FIG. 3 shows the skew resulting from a rounded turn. In each example, it is easy to see that the distance traveled by the signal in one of the traces is longer than the path traveled by the other signal. In the example of FIG. 1, this increased distance, or skew, is equal to a+b, or 2 p. In the example of FIG. 2, the skew is equal to c+d+e+f, or $4(p \cdot \tan\Theta)$, or 1.65 p. In the example of FIG. 3, the skew is equal to h−g, or $(\pi/2)(r+p)-(\pi/2 \cdot r)$, or 1.57 p.

Designers of PCBs have traditionally tried to combat delay skew in differential signals by laying out differential signal traces so that every turn in one direction has a corresponding turn in the opposite direction. Such a technique can be very difficult to accomplish in practice, however, as the complexity of PCBs often does not allow the designer to match every turn in the differential signal traces with an opposite turn elsewhere on the board.

SUMMARY

Described below is a printed circuit board that includes at least two conductive traces (e.g., a differential signal pair), each having a first portion and a second portion. The printed circuit board also includes a cross-over section that includes two electrically conductive portions, each connecting electrically to the first and second portions of a corresponding one of the conductive traces, such that the conductive traces in their first portions lie on opposite sides of each other as they do in their second portions.

On some boards, the cross-over section includes a thru-hole via in which the two electrically conductive portions reside, each formed to carry one of the conductive traces from one layer of the printed circuit board to another layer. The thru-hole often penetrates all of the layers.

The electrically conductive portions are also often formed to rotate around a surface of the thru-hole via, such that a position at which each conductive trace exits the thru-hole via is offset by some angle (e.g., 180 degrees) from a position at which the trace enters the thru-hole via. When the printed circuit board has multiple layers, the electrically conductive portions are often formed to rotate around the surface of the thru-hole via between two of the layers. In some cases, one of the electrically conductive portions is formed to rotate around the surface of the thru-hole via between one pair of layers and another of the electrically conductive portions is formed to rotate around the surface of the thru-hole via between another pair of layers. The electrically conductive portions are also often formed to rotate continuously from one end of the thru-hole via to its other end.

For some boards, the cross-over section includes a flexible circuit mounted such that it is twisted on itself. On some of these boards, the cross-over section also includes a thru-hole via into which the flexible circuit is mounted. The flexible circuit often connects mechanically and electrically to electrically conductive pads formed at each end of the thru-hole via, and the conductive traces also connect electrically to these electrically conductive pads. For other boards, the flexible circuit and the first and second portions of the conductive traces all lie on one layer of the board. Quite often, the flexible circuit is twisted one-half turn.

Other features and advantages will become apparent from the description and claims that follow.

DETAILED DESCRIPTION

Figure 4:
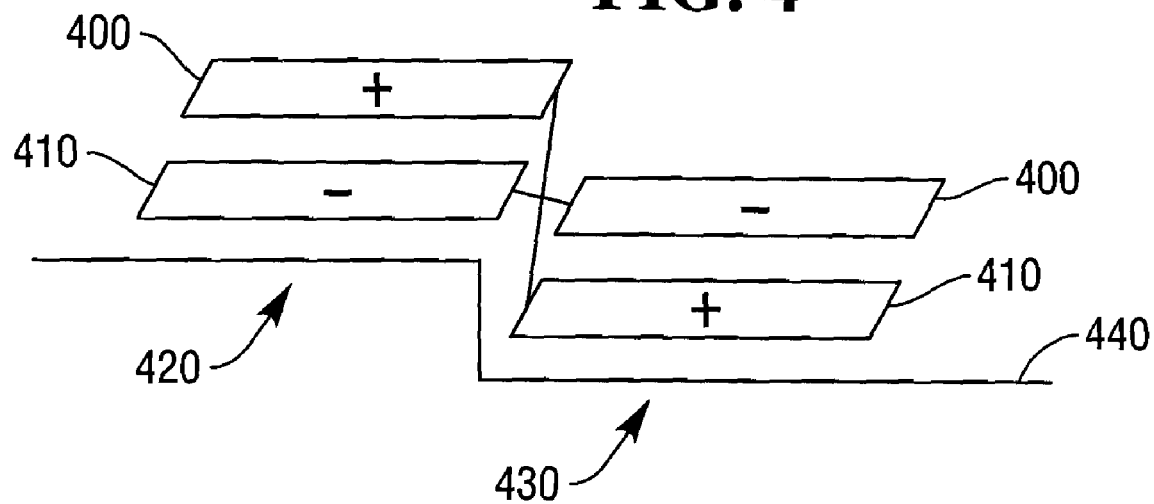
FIG. 4 is a diagram showing a pair of differential signal traces that cross each other to avoid the delay skew traditionally caused by turns in the layout of the signal traces.

FIG. 4 shows generally a technique for use in reducing, if not eliminating altogether, the delay skew that ordinarily results in a pair of differential signal traces 400, 410 on a multi-layer printed circuit board (PCB). As the signal traces transition from a first layer 420 of the PCB to a second layer 430, the signal traces "cross" each other, each switching positions with the other on the PCB. For example, if one of the signal traces 410 runs closer to the outer edge 440 of the PCB on its first layer 420, then the other signal trace 400, after the cross, would run closer to the outer edge 440 of the board on the second layer 430. Crossing the traces in this manner once for every pair of turns in the same direction (e.g., once for every pair of right-handed or every pair of left-handed turns) equalizes the distances over which the traces travel and thus reduces the effects of delay skew in the signal traces.

Figure 1:
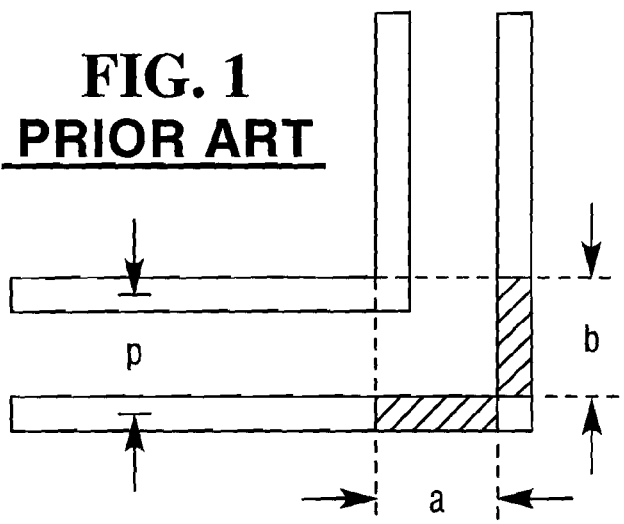
FIGS. 1, 2 and 3 are diagrams illustrating the phenomenon of delay skew in a pair of differential signal traces on a printed circuit board (PCB).
Figure 2:
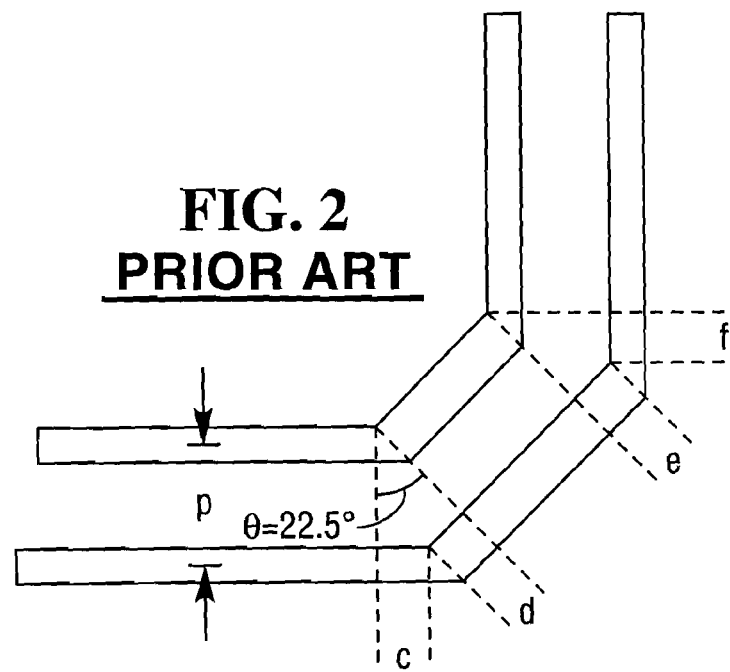
Figure 3:
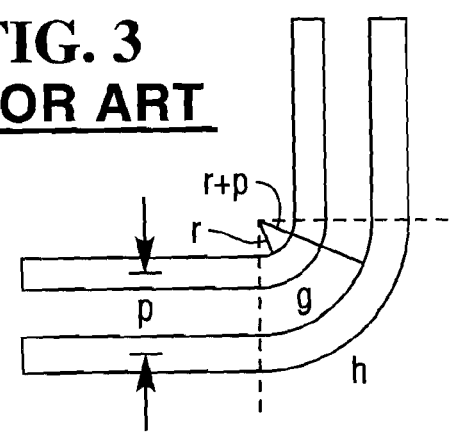
Figure 5:
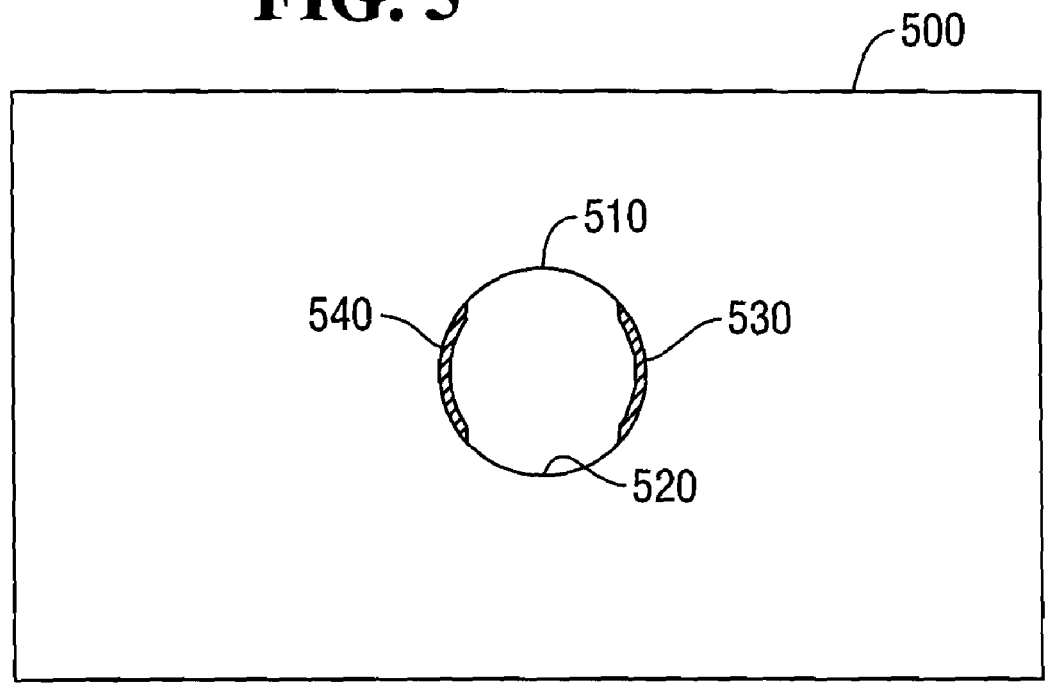
FIG. 5 is a diagram showing a circuit board with a thru-hole via for use in crossing differential signal traces.

FIG. 5 shows a multi-layer PCB 500 having a thru-hole via 510 that is constructed to allow multiple conductive traces, such as the differential signal traces of FIG. 1, to pass from one layer of the PCB to another layer of the PCB. The thru-hole via 510 is constructed so that its internal surface 520 includes multiple conductive portions 530, 540 that are separated physically by gaps. This ensures that the conductive portions 530, 540 are electrically isolated—i.e., that no electrically conductive path exists between the conductive portions 530, 540 when the PCB is fabricated and has not yet been populated with electronic components. A process for fabricating such a thru-hole via 510 in a PCB is described in detail in the U.S. application incorporated by reference above.

Figure 6:
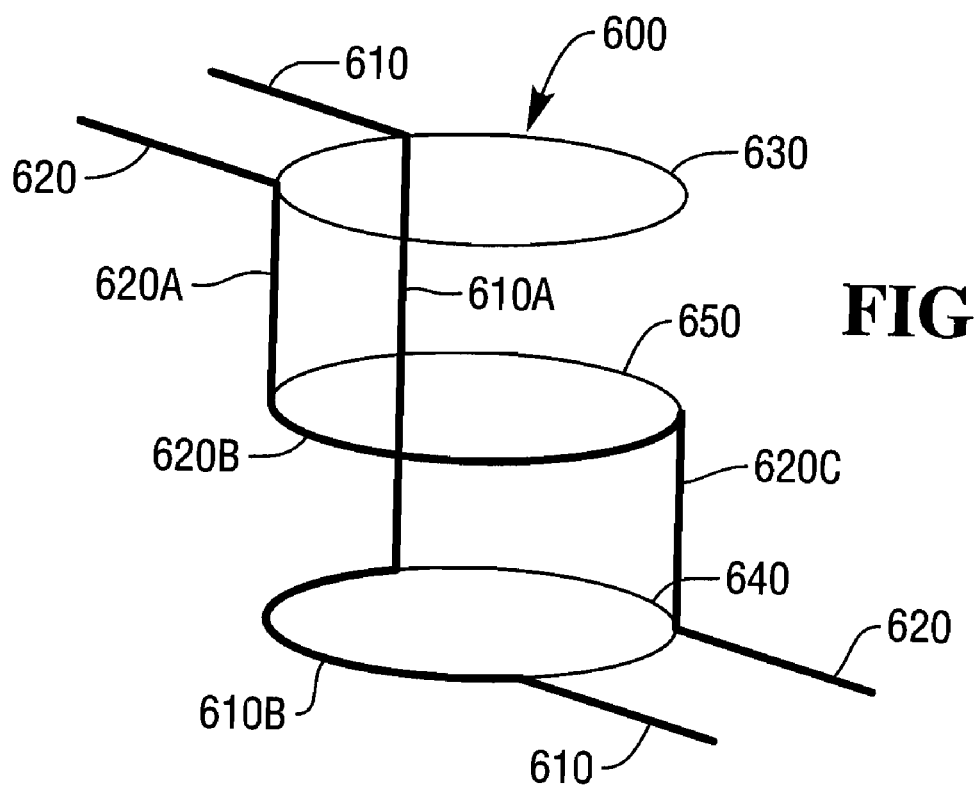
FIGS. 6 and 7 are diagrams showing alternative structures for a thru-hole via used in crossing differential signal traces.

FIG. 6 shows one structure of a thru-hole via 600, like that of FIG. 5, through which both signal traces 610, 620 of a differential pair pass in transitioning from a first layer 630 of a multi-layer PCB to a second layer 640. In this example, the signal traces 610, 620 cross each other and exit the thru-hole via 600 at an angular position that is 180 degrees separated from the position at which the signal traces 610, 620 enter the thru-hole via 600. To accomplish this type of 180-degree crossing of the signal traces 610, 620, a third layer 650 of the PCB, positioned physically between the first and second layers 630, 640, is used to assist in providing the degree of rotation necessary for the signal traces.

As shown here, the differential signal traces 610, 620 enter the thru-hole via 600 on the first layer 630 of the PCB, with a first one of the signal traces 610 lying to the right side of the second trace 620. The first signal trace 610, on entering the thru-hole via, first follows a path 610A that carries it straight down along the surface of the thru-hole via 600 to the second layer 640 of the PCB. On reaching the second layer 640, the first signal trace then follows a path 610B that carries it around the surface of the thru-hole via 600 to a position that is 180 degrees separated from the position at which it entered the thru-hole via 600. From this point, the first signal trace 610 exits the thru-hole via 600 and travels along the second surface 640 of the PCB.

The second signal trace 620, on entering the thru-hole via 600, first follows a path 620A that carries it straight down along the surface of the thru-hole via 600 to the third layer 650 of the PCB. On reaching the third layer 650, the second signal trace then follows a path 620B that carries it around the surface of the thru-hole via 600 to a position that is 180 degrees separated from the position at which it entered the thru-hole via 600. From this point, the second signal trace 620 follows a path 620C that carries it straight down along the surface of the thru-hole via 600 to the second layer 640 of the PCB. From this point, the second signal trace 620 exits the thru-hole via 600 and travels along the second surface 640 of the PCB.

On exiting the thru-hole via 600, the differential signal traces 610, 620 have switched positions, so that the second signal trace 620 lies to the right side of the first signal trace 610 on the second layer 640 of the PCB. Also, the distances over which the differential signal traces 610, 620 travel between their entry into and their exit from the thru-hole via 600 are identical, meaning that no delay skew is introduced in the differential signal traces as a result of their crossing in the thru-hole via 600.

One technique for creating a thru-hole via like that shown in FIG. 6 is by drilling a hole in each of the individual layers of the PCB to form the portion of the thru-hole via that resides in that layer, and then plating the appropriate portion of the hole's surface with the electrically conductive material that forms the signal traces before laminating the PCB layers together. After lamination, the holes in the layers and the conductive material on their surfaces will line up as necessary to form the thru-hole via with the crossing signal traces on its surface.

Figure 7:
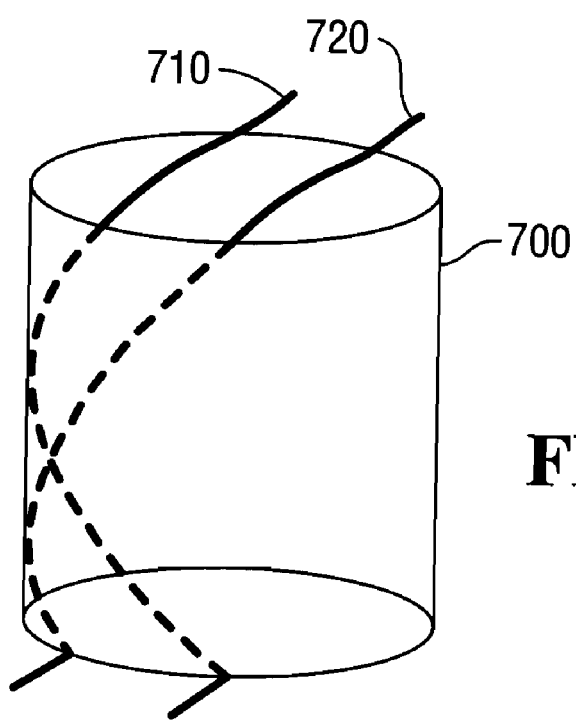

FIG. 7 shows an alternative structure of a thru-hole via 700 that allows a pair of differential signal traces 710, 720 entering the thru-hole via to cross each other while transitioning from one layer of a PCB to another and then exit the via at positions that are separated by 180 degrees from the positions at which they entered the via. In this example, the entire surface of the thru-hole via 700 is coated with an electrically conductive material. The coated surface is then treated through some process, e.g., chemical etching or laser etching of the conductive material, to remove all of the conductive material from the surface of the thru-hole via 700 except for those portions that form the differential signal traces 710, 720.

Figure 8A:
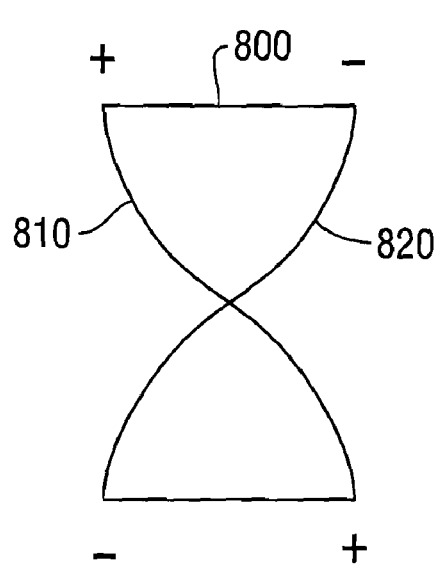
FIGS. 8A and 8B are diagrams showing a flex circuit for use in a thru-hole via in crossing differential signal traces.
Figure 8B:
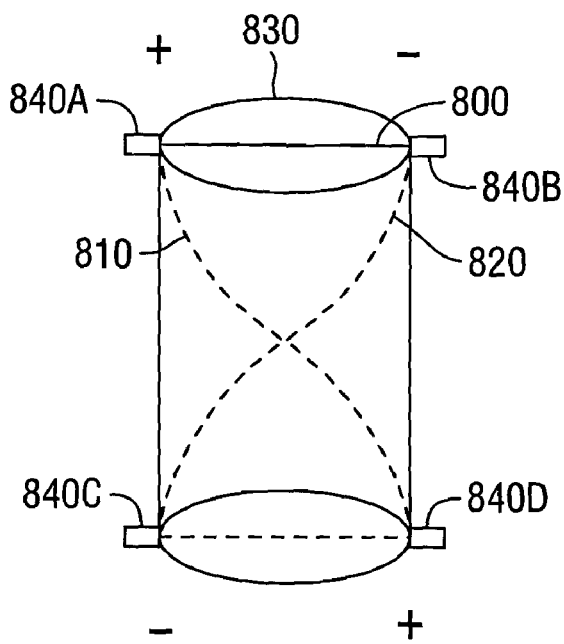

FIGS. 8A and 8B show an alternative technique for crossing differential signal traces 810, 820 in a multi-layer PCB. This technique involves the use of a small flexible circuit 800 through which the differential signal traces 810, 820 pass. The flexible circuit 800 is mounted within a thru-hole via 830 in the PCB, e.g., by connecting the ends of the flexible circuit 800 mechanically and electrically to conductive pads 840A-D along the surface of the thru-hole via 830. The differential signal traces 810, 820 enter the thru-hole via 830, and thus the flexible circuit 800, at the two mounting pads 840A-B on one end of the thru-hole via 830; the differential signal traces 810, 820 exit the thru-hole via 830 and the flexible circuit 800 at the two mounting pads 840C-D on the other end of the thru-hole via 830. Within the thru-hole via 830, the flexible circuit 800 is twisted one-half turn, so that the each of differential signal traces 810, 820 exits the thru-hole via 830 at a position that is separated by 180 degrees from the position at which it entered the thru-hole via 830.

In general, the flexible circuit is manufactured by embedding electrically conductive signal traces between two thin sheets of dielectric substrate material that are laminated together. Flexible circuits and their fabrication are well known in the art of PCB manufacturing and are not described in any more detail here.

Figure 9:
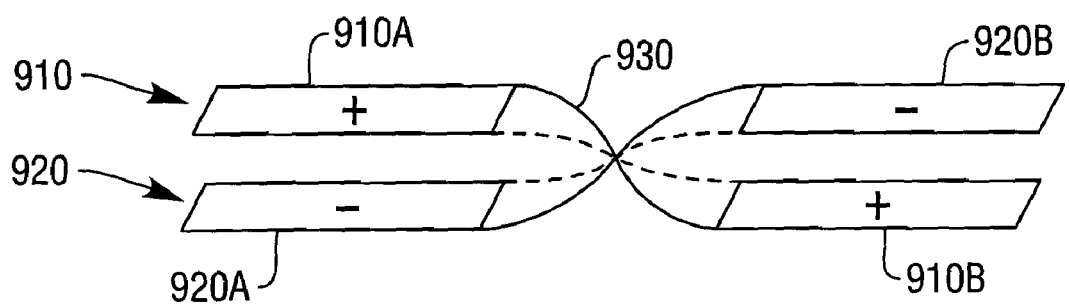
FIG. 9 is a diagram showing the use of flex circuits in a pair of differential signal traces to cross the signal traces.

FIG. 9 shows a technique for use in crossing a pair of differential signal traces 910, 920 on a single layer of a PCB, without using a thru-hole via like those described above. With this technique, a flexible circuit 930 is used to match a first portion 910A of a first one of the differential signal traces 910 with a second portion 910B of the first trace and to match a first portion 920A of the second differential signal trace 920 with a second portion 920B of the second trace.

As shown here, the first differential signal trace 910 lies to the right side of the second differential trace 920 as the traces enter the flexible circuit 930 and to the left side of the second differential trace 920 as the traces exit the flexible circuit 930. To accomplish this result, the flexible circuit 930 is twisted one-half turn before it is mounted to the PCB, typically by mounting it both mechanically and electrically to mounting pads (not shown) on the PCB to which the differential signal traces 910, 920 also connect.

The text above describes one or more specific embodiments of a broader invention. The invention also is carried out in a variety of alternative embodiments and thus is not limited to those described here. For example, while the techniques described here are done so in the context of differential signal pairs for the purpose of delay-skew elimination, the techniques apply just as well to all conductive traces, even those that do not carry differential signals. Many other embodiments are also within the scope of the following claims.

We claim:

1. A printed circuit board comprising:
   at least two conductive traces, each having a first portion and a second portion; and
   a cross-over section that includes two electrically conductive portions, each connecting electrically to the first and second portions of a corresponding one of the conductive traces, such that the conductive traces in their first portions lie on opposite sides of each other as they do in their second portions, where the cross-over section includes a thru-hole via in which the two electrically conductive portions reside, each formed to carry one of the conductive traces from one layer of the printed circuit board to another layer.

2. The printed circuit board of claim 1, where the printed circuit board has multiple layers, and where the electrically conductive portions are formed to carry the conductive traces from one layer to another layer.

3. The printed circuit board of claim 1, where the electrically conductive portions are formed to rotate around a surface of the thru-hole via, such that a position at which each conductive trace exits the thru-hole via is offset by some angle from a position at which the trace enters the thru-hole via.

4. The printed circuit board of claim 3, where the angle of the offset is 180 degrees for each of the conductive traces.

5. The printed circuit board of claim 3, where the printed circuit board has multiple layers, and where electrically conductive portions are formed to rotate around the surface of the thru-hole via between two of the layers.

6. The printed circuit board of claim 5, where one of the electrically conductive portions is formed to rotate around the surface of the thru-hole via between one pair of layers, and where another of the electrically conductive portions is formed to rotate around the surface of the thru-hole via between another pair of layers.

7. The printed circuit board of claim 6, where each of the electrically conductive portions is formed to rotate around the surface of the thru-hole via by 180 degrees.

8. The printed circuit board of claim 1, where the electrically conductive portions are formed to rotate continuously from one end of the thru-hole via to its other end.

9. The printed circuit board of claim 8, where the electrically conductive portions are formed to make a total rotation of 180 degrees.

10. The printed circuit board of claim 1, where the printed circuit board has multiple layers and the thru-hole via penetrates all of the layers.

11. The printed circuit board of claim 1, where the conductive traces carry a differential signal pair.

12. At least two conductive traces, each having a first portion and a second portion; and
   a cross-over section that includes two electrically conductive portions, each connecting electrically to the first and second portions of a corresponding one of the conductive traces, such that the conductive traces in their first portions lie on opposite sides of each other as they do in their second portions where the cross-over section includes a flexible circuit mounted such that it is twisted on itself.

13. The printed circuit board of claim 12, where the cross-over section also includes a thru-hole via into which the flexible circuit is mounted.

14. The printed circuit board of claim 13, where the flexible circuit connects mechanically and electrically to electrically conductive pads formed at each end of the thru-hole via.

15. The printed circuit board of claim 14, where the conductive traces also connect electrically to the electrically conductive pads.

16. The printed circuit board of claim 12, where the flexible circuit and the first and second portions of the conductive traces all lie on one layer of the printed circuit board.

17. The printed circuit board of claim 12, where the flexible circuit is twisted one-half turn.

* * * * *